(12) United States Patent
Takeuchi

(10) Patent No.: US 6,175,506 B1
(45) Date of Patent: Jan. 16, 2001

(54) MULTILAYER PRINTED CIRCUIT BOARD

(75) Inventor: Yasushi Takeuchi, Tokyo (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/237,246

(22) Filed: Jan. 26, 1999

(30) Foreign Application Priority Data

Jan. 27, 1998 (JP) .................................................. 10-013981

(51) Int. Cl.⁷ ...................................................... H05K 1/18
(52) U.S. Cl. .......................... 361/794; 361/780; 361/783; 361/765; 174/260; 174/261; 228/180.21
(58) Field of Search ..................................... 361/794, 783, 361/780, 765; 174/253, 255, 260, 261, 265, 266; 333/246, 247; 228/180.21, 180.27; 257/773, 786, 774

(56) References Cited

U.S. PATENT DOCUMENTS

| 5,309,024 | * | 5/1994 | Hirano | 23/48 |
|---|---|---|---|---|
| 5,315,069 | * | 5/1994 | Gebara | 174/250 |
| 5,408,053 | * | 4/1995 | Young | 174/264 |
| 5,714,718 | * | 2/1998 | Tanaka | 174/255 |
| 5,719,750 | * | 2/1998 | Iwane | 361/794 |
| 5,768,109 | * | 6/1998 | Gulick et al. | 361/794 |
| 5,815,373 | * | 9/1998 | Johnsen et al. | 361/763 |
| 5,835,979 | * | 11/1998 | Hiraki et al. | 174/33 |
| 5,847,936 | * | 12/1998 | Forehand et al. | 361/794 |
| 5,854,534 | * | 12/1998 | Beilin et al. | 257/691 |
| 5,966,294 | * | 10/1999 | Harada et al. | 361/794 |

* cited by examiner

Primary Examiner—Jeffrey Gaffin
Assistant Examiner—David Foster
(74) Attorney, Agent, or Firm—Fitzpatrick, Cella, Harper & Scinto

(57) ABSTRACT

In a multilayer printed circuit board having at least two conductive layers, including a power-supply layer with a plurality of power-supply planes having different supply voltages and a ground layer, a circuit pattern for transmitting a signal serving as a radiation noise source is formed on a conductive layer facing the ground layer in order to suppress generation of radiation noise.

18 Claims, 10 Drawing Sheets

MULTILAYER PRINTED CIRCUIT BOARD

BACKGROUND OF THE INVENTION

1. Field of the Invention

The present invention relates to a multilayer printed circuit board including a power-supply layer where a plurality of power-supply planes are provided, and more particularly, to a multilayer printed circuit board in which generation of radiation noise is suppressed.

2. Description of the Related Art

Conventionally, when designing a multilayer printed circuit board, it is common to provide at least one power-supply layer and at least one ground layer, in addition to a signal layer. Particularly, in an electronic apparatus operating with conventional digital logic circuits, since the power-supply voltage used in a power-supply layer is mainly 5 V, the entire surface of the power-supply layer is, in most cases, constituted by a 5V single 5V-power-supply plane. Recently, however, as digital ICs (integrated circuits) tend to be operated at a lower voltage and to consume lower power, ICs operated with a 5V power supply and ICs operated with a power-supply voltage of 3.3 V or less have come to be mounted, mixed with each other on a single printed circuit board.

As for substrates incorporated in a computer, in order to reduce power consumption by providing a power management function, 5V and 3.3V power supplies are further divided, for example, into 5V-A, 5V-B and 5V-C, and 3.3V-A, 3.3V-B and 3.3V-C, . . . power supplies, respectively, so that many power supplies are often mixed.

As a result, the power-supply layer of a multilayer printed circuit board is not just a single 5V power-supply plane as in the conventional approach, but is divided into 5V and 3.3V power-supply planes, or still more power-supply planes, in order to supply ICs with different required voltages.

A conventional multilayer printed circuit board will now be described with reference to FIGS. 11 through 14.

FIG. 11 is a plan view illustrating the configuration of a first conductive layer in this conventional multilayer printed circuit board.

The first conductive layer comprises a first signal layer 101 provided at the surface side of the multilayer printed circuit board. A first output-side IC 102 operating with a 5V power supply and a second output-side IC 103 operating with a 3.3V power supply are mounted on the first signal layer 101 as electronic devices mounted on the multilayer printed circuit board.

One of the terminals of the first output-side IC 102 is connected to one end of a circuit pattern 104a for a 5V clock signal, where a clock signal having an amplitude of 5 V is transmitted. Another end of the circuit pattern 104a for the 5V clock signal is connected to a through-hole 105 subjected to interlayer connection to one end of a circuit pattern 104b for the 5V clock signal provided on a second signal layer 116 (see FIG. 14). Another terminal of the first output-side IC 102 is connected to a through-hole 106 subjected to interlayer connection to a power supply layer 112 (see FIG. 13) in order to supply the first output-side IC 102 with a power-supply voltage of 5V.

One of the terminals of the second output-side IC 103 is connected to one end of a circuit pattern 107 for a 3.3V clock signal where a clock signal having an amplitude of 3.3 V is transmitted. Another end of the circuit pattern 107 for the 3.3V clock signal is connected to a through-hole 108 connected to an input terminal of a second input-side IC mounted on the second signal layer 116 (see FIG. 14). Another terminal of the second output-side IC 103 is connected to a through-hole 109 subjected to interlayer connection to the power-supply layer 112 in order to supply the second output-side IC 103 with a suitable power-supply voltage.

FIG. 12 is a plan view illustrating the configuration of a second conductive layer in the conventional multilayer printed circuit board.

The second conductive layer comprises a ground layer 110 provided in an inner layer below the first signal layer 101. The ground layer 110 is provided in the form of a uniform plane.

FIG. 13 is a plan view illustrating the configuration of a third conductive layer in the conventional multilayer printed circuit board.

The third conductive layer comprises the power-supply layer 112 provided in an inner layer below the ground layer 110. A 5V-power-supply plane 113 and a 3.3V-power-supply plane 114 are provided on the power-supply layer 112. The above-described through hole 106 is connected to the 3.3V-power-supply plane 114.

FIG. 14 is a plan view illustrating the configuration of a fourth conductive layer in the conventional multilayer printed circuit board.

The fourth conductive layer comprises the second signal layer 116 provided at the back of the multilayer printed circuit board. A first input-side IC 117 operating with a 5V power supply and a second input-side IC 118 operating with a 3.3V power supply are mounted on the second signal layer 116 as electronic devices mounted on the multilayer printed circuit board.

One of the terminals of the first input-side IC 117 is connected to one end of the circuit pattern 104b for the 5V clock signal, where the clock signal having the amplitude of 5 V is transmitted. Another end of the circuit pattern 104b for the 5V clock signal is connected to the above-described through-hole 105. Another terminal of the first input-side IC 117 is connected to a through-hole 119 subjected to interlayer connection to the power-supply layer 112 in order to supply the first input-side IC 117 with a power-supply voltage of 5 V.

One of the terminals of the second input-side IC 118 is connected to the above-described through-hole 108. Another terminal of the second input-side IC 118 is connected to a through-hole 120 subjected to interlayer connection to the power-supply layer 112 in order to supply the second input-side IC 118 with a power-supply voltage.

In the above-described conventional multilayer printed circuit board, circuit patterns for various signals (not shown) including the circuit patterns 104a, 104b and 107 for respective clock signals are provided on the first signal layer 101 and the second signal layer 116. The circuit patterns 104a and 104b for the 5V clock signal are connected to each other between the first signal layer 101 and the second signal layer 116.

Thus, a microstrip structure is provided between the circuit pattern 107 for the 3.3V clock signal provided on the first signal layer 101, and the ground layer 110, and a microstrip structure is also provided between the circuit pattern 104b for the 5V clock signal provided on the second signal layer 116, and the power supply layer 112 in a state in which the circuit pattern 104b for the 5V clock signal crosses over the 3.3V-power-supply plane 114.

In the configuration where the ground layer 110 is provided immediately below the circuit pattern 107 for the 3.3V clock signal on the first signal layer 101, capacitive coupling and inductive coupling between the circuit pattern 107 for the 3.3V clock signal and the ground layer 110 are large. Accordingly, when a signal current flows from the second output-side IC 103 to the second input-side IC 118 via the circuit pattern 107 for the 3.3V clock signal and the through-hole 108, a return current caused by the signal current rectilinearly flows through a current path 111 on the ground layer 110 immediately below the circuit pattern 107 for the 3.3V clock signal.

In the configuration that the power-supply layer 112 is provided immediately below the circuit pattern 104b for the 5V clock signal on the second signal line 116, capacitive coupling and inductive coupling between the circuit pattern 104b for the 5V clock signal and the power-supply layer 112 are large. Accordingly, when a signal current flows from the first output-side IC 102 to the first input-side IC 117 via the through-hole 105 and the circuit pattern 104b for the 5V clock signal, a return current caused by the signal current flows through a current path 115 on the power-supply layer 112. Since the circuit pattern 104b for the 5V clock signal is provided so as to cross over the 3.3V-power-supply plane 114, the return current detours around the 3.3V-power-supply plane 114 instead of rectilinearly flowing immediately below the circuit pattern 104b for the 5V clock signal.

Next, a description will be provided of another conventional multilayer printed circuit board, with reference to FIGS. 15 through 20.

FIG. 15 is a plan view illustrating the configuration of a first conductive layer in this conventional multilayer printed circuit board.

The first conductive layer comprises a first signal layer 201 provided at the surface side of the multilayer printed circuit board. A first output-side IC 202 operating with a 5V power supply and a second output-side IC 203 operating with a 3.3V power supply are mounted on the first signal layer 201, as electronic devices mounted on the multilayer printed circuit board.

One of the terminals of the first output-side IC 202 is connected to one end of a circuit pattern 204a for a 5V clock signal where a clock signal having an amplitude of 5 V is transmitted. Another end of the circuit pattern 204a for the 5V clock signal is connected to a through-hole 205a subjected to interlayer connection to one end of a circuit pattern 204b for the 5V clock signal provided on a third signal layer 218 (see FIG. 19). Another terminal of the first output-side IC 202 is connected to a through-hole 206 in order to supply the first output-side IC 202 subjected to interlayer connection to a power-supply layer 214 with a power-supply voltage of 5 V.

One of terminals of the second output-side IC 203 is connected to a through-hole 209 subjected to interlayer connection to one end of a circuit pattern 207 for a 3.3V clock signal provided on a second signal layer 211 (see FIG. 16). Another terminal of the second output-side IC 203 is connected to a through-hole 210 subjected to interlayer connection to a power-supply layer 214 (see FIG. 18) in order to supply the second output-side IC 203 with a power-supply voltage.

FIG. 16 is a plan view illustrating the configuration of a second conductive layer in the above-described multilayer printed circuit board.

The second conductive layer comprises the second signal layer 211 provided in an inner layer below the first signal layer 201. The circuit pattern 207 for the 3.3V clock signal where a clock signal having an amplitude of 3.3 V is transmitted is provided on the second signal layer 211. One end of the circuit pattern 207 for the 3.3V clock signal is connected to the above-described through-hole 209. Another end of the circuit pattern 207 for the 3.3V clock signal is connected to a through-hole 208 where an input terminal of a second input-side IC 221 mounted on a fourth signal layer 219 (see FIG. 20) is connected.

FIG. 17 is a plan view illustrating the configuration of a third conductive layer in the above-described multilayer printed circuit board.

The third conductive layer comprises a ground layer 212 provided in an inner layer below the second signal layer 211.

FIG. 18 is a plan view illustrating the configuration of a fourth conductive layer in the above-described multilayer printed circuit board.

The fourth conductive layer comprises a power-supply layer 214 provided in an inner layer below the ground layer 212. A 5V-power-supply plane 215 and a 3.3V-power-supply plane 216 are provided on the power-supply layer 214. The above-described through-hole 206 is connected to the 3.3V-power-supply plane 216, and the through-hole 210 is connected to the 3.3V-power-supply plane 216.

FIG. 19 is a plan view illustrating the configuration of a fifth conductive layer in the above-described multilayer printed circuit board.

The fifth conductive layer comprises a third signal layer 218 provided in an inner layer below the ground layer 212. The circuit pattern 204b for the 5V clock signal where a clock signal having an amplitude of 5 V is transmitted is provided on the third signal layer 218. One end of the circuit pattern 204b for the 5V clock signal is connected to the above-described through-hole 205a. Another end of the circuit pattern 204b for the 5V clock signal is connected to a through-hole 205b connected to one of terminals of a first input-side IC 220 mounted on the fourth signal layer 219 (see FIG. 20).

FIG. 20 is a plan view illustrating the configuration of a sixth conductive layer in the above-described multilayer printed circuit board.

The sixth conductive layer comprises the fourth signal layer 219 provided at the back of the multilayer printed circuit board. The first input-side IC 220 operating with a 5V power supply and a second input-side IC 221 operating with a 3.3V power supply are mounted on the fourth signal layer 219, as electronic devices mounted on the multilayer printed circuit board.

One of the terminals of the first input-side IC 220 is connected to the through-hole 205b connected to one end of the circuit pattern 204b for the 5V clock signal. Another terminal of the first input-side IC 220 is connected to a through-hole 222 subjected to interlayer connection to the power-supply layer 214 in order to supply the first input-side IC 220 with a power-supply voltage of 5 V.

One of the terminals of the second input-side IC 221 is connected to the above-described through-hole 208. Another terminal of the second input-side IC 221 is connected to a through-hole 223 subjected to interlayer connection to the power-supply layer 214 in order to supply the second input-side IC 221 with a power-supply voltage.

In the above-described conventional multilayer printed circuit board, circuit patterns for various signals (not shown) including the circuit patterns 204b and 207 for respective clock signals are provided on the second signal layer 211 and the third signal layer 218.

Thus, a microstrip structure is provided between the circuit pattern 210 for the 3.3V clock signal provided on the second signal layer 211, and the ground layer 212, and a microstrip structure is also provided between the circuit pattern 204b for the 5V clock signal provided on the third signal layer 118, and the power supply layer 214 in a state in which the circuit pattern 204b for the 5V clock signal crosses over the 3.3V-power-supply plane 216.

In the configuration where the ground layer 212 is provided immediately below the circuit pattern 207 for the 3.3V clock signal on the second signal layer 211, capacitive coupling and inductive coupling between the circuit pattern 207 for the 3.3V clock signal and the ground layer 212 are large. Accordingly, when a signal current flows from the second output-side IC 203 to the second input-side IC 222 via the circuit pattern 207 for the 3.3V clock signal and the through-hole 208, a return current caused by the signal current rectilinearly flows through a current path 213 on the ground layer 212 immediately below the circuit pattern 207 for the 3.3V clock signal.

In the configuration where the power-supply layer 213 is provided immediately below the circuit pattern 204b for the 5V clock signal on the third signal line 218 so as to face it, capacitive coupling and inductive coupling between the second signal layer 218 and the power-supply layer 214 are large. Accordingly, when a signal current flows from the first output-side IC 202 to the first input-side IC 220 via the through-hole 205a, the circuit pattern 204b for the 5V clock signal and the through hole-205b, a return current caused by the signal current flows through a current path 217 on the power-supply layer 214. Since the circuit pattern 204b for the 5V clock signal is provided so as to cross over the 3.3V-power-supply plane 216, the return current detours around the 3.3V-power-supply plane 216 instead of rectilinearly flowing immediately below the circuit pattern 204b for the 5V clock signal.

In the above-described multilayer printed circuit boards, since a microstrip structure is provided between the signal layer and the power supply layer or the ground layer, the signal transmission line characteristic impedance is constant. As a result, a high-quality transmission waveform is obtained, and a signal, such as a clock signal or the like, which serves as a radiation source having the largest electromagnetic radiation noise from the printed circuit board, is transmitted with high reliability in a state in which the electromagnetic radiation noise is suppressed.

However, in the above-described conventional multilayer printed circuit boards, since the circuit pattern for the clock signal is provided so as to cross over the power-supply plane having a power-supply voltage different from the voltage of a signal transmitted through the circuit pattern for the clock signal, a return current flows in the power-supply layer so as to detour around the power-supply plane.

Since the return current flows with a large loop instead of flowing through the shortest rectilinear distance, electromagnetic radiation noise radiated from the printed circuit board increases in proportion to the length of the loop. As a result, control values provided by organizations of various countries, such as VCCI (Voluntary Control Council for Interference by Data Processing Equipment and Electronic Office Machines), FCC (Federal Communications Commission), CISPR (International Special Committee on Radio Interference) and the like, cannot, in some cases, be met.

SUMMARY OF THE INVENTION

The present invention has been made in consideration of the above-described problems.

It is an object of the present invention to provide a multilayer printed circuit board in which generation of radiation noise is suppressed.

It is another object of the present invention to provide a circuit pattern for transmitting a signal, serving as a radiation noise source, on a conductive layer facing a ground layer in a multilayer printed circuit board including a power-supply layer where a plurality of power-supply planes having different supply voltages are provided.

It is still another object of the present invention to provide a multilayer printed circuit board in which at least one power-supply plane in a power-supply layer is divided, and a circuit pattern is provided between power-supply planes obtained by dividing the original power-supply plane.

According to one aspect, the present invention relates to a multilayer printed circuit board including a first signal layer forming one of outer surfaces, the first signal layer including first electronic components, each generating a signal serving as a radiation noise source, a second signal layer forming another outer surface, the second signal layer including second electronic components receiving the signals from the first electronic components provided on the first signal layer, and a power-supply layer provided between the first signal layer and the second signal layer. The power-supply layer includes a plurality of power-supply planes having different supply voltages. At least one of the plurality of power-supply planes is divided. A circuit pattern for electrically connecting the first electronic components and the second electronic components to each other is provided between power-supply planes obtained by dividing the original power-supply plane. The multilayer printed circuit board also includes a ground layer provided between one of the first signal layer and the second signal layer, and the power-supply layer. The ground layer is provided so as to face the circuit pattern of the power-supply layer.

According to another aspect, the present invention relates to a multilayer printed circuit board including a signal layer including at least one electronic component generating a signal serving as a radiation noise source, and a power-supply layer including a plurality of power-supply planes having different supply voltages. At least one power-supply plane from among the plurality of power-supply planes is divided, and a circuit pattern for transmitting the signal serving as the radiation noise source generated from the component is provided between power-supply planes obtained by dividing the original power-supply plane. The multilayer printed circuit board also includes a ground layer provided between the signal layer and the power-supply layer. The ground layer is provided so as to face the circuit pattern on the power-supply layer.

According to still another aspect, the present invention relates to a multilayer printed circuit board including a first signal layer including at least one electronic component generating a signal serving as a radiation-noise source, a second signal layer including at least one other electronic component receiving the signal from the at least one electronic component provided on the first signal layer, and a power-supply layer provided between the first signal layer and the second signal layer. The power-supply layer includes a plurality of power-supply planes having different supply voltages, and a circuit pattern for electrically connecting the first electronic component and the second electronic component to each other. The multilayer printed circuit board also includes a ground layer provided between one of the first signal layer and the second signal layer, and the power-supply layer. The ground layer is provided so as to face the circuit pattern on the power-supply layer.

According to yet another aspect, the present invention relates to a multilayer printed circuit board including a first signal layer including at least one electronic component generating a signal serving as a radiation-noise source, a second signal layer including at least one other electronic component receiving the signal from the at least one electronic component provided on the first signal layer, and a power-supply layer provided between the first signal layer and the second signal layer. The power-supply layer includes a plurality of power-supply planes, and a circuit pattern for electrically connecting the first electronic component and the second electronic component to each other. The multilayer printed circuit board also includes a ground layer provided between the first signal layer and the power-supply layer. The ground layer is provided so as to face the circuit pattern of the power-supply layer.

According to yet a further aspect, the present invention relates to a multilayer printed circuit board including electronic components, each generating a signal, serving as a radiation noise source, on a signal layer. The multilayer printed circuit board includes a power-supply layer including a plurality of power-supply planes having different supply voltages. The power-supply layer includes a circuit pattern for transmitting the signals, serving as radiation noise sources, generated from the electronic components provided on the signal layer. The multilayer printed circuit board also includes a ground layer provided so as to face the circuit pattern on the power-supply layer.

According to still another aspect, the present invention relates to a multilayer printed circuit board including a first signal layer including at least one of each of first and second electronic components, each generating a signal serving as a radiation noise source. The first signal layer includes a first circuit pattern for transmitting the signal serving as the radiation noise source generated from the first electronic component. The multilayer printed circuit board also includes a second signal layer including at least one of each of third and fourth electronic components receiving the signals from the at least one of each of the first and second electronic components provided on the first signal layer, and a power-supply layer provided between the first signal layer and the second signal layer. The power-supply layer includes first and second power-supply planes having different supply voltages. The first power-supply plane supplies the first and third electronic components with a voltage, and the second power-supply plane supplies the second and fourth electronic components with a voltage. The power-supply layer also includes a second circuit pattern for transmitting the signal, serving as the radiation noise source, generated from the second electronic component. The multilayer printed circuit board also includes a ground layer provided between the first signal layer and the power-supply layer. The ground layer is provided so as to face the first circuit pattern on the first signal layer and the second circuit pattern on the power-supply layer.

According to still another aspect, the present invention relates to a multilayer printed circuit board including a signal layer including at least one of each of first and second electronic components, each generating a signal serving as a radiation noise source. The first signal layer includes a first circuit pattern for transmitting the signal serving as the radiation noise source generated from the first electronic component. The multilayer printed circuit board also includes a power-supply layer including first and second power-supply planes having different supply voltages. The first power-supply plane supplies the first electronic component with a voltage, and the second power-supply plane supplies the second electronic component with a voltage. The power-supply layer also includes a second circuit pattern for transmitting the signal, serving as the radiation-noise source, generated from the second electronic component. The multilayer printed circuit board also includes a ground layer provided between the signal layer and the power-supply layer. The ground layer is provided so as to face the first circuit pattern on the signal layer and the second circuit pattern on the power-supply layer.

The foregoing and other objects, advantages and features of the present invention will become more apparent from the following description of the preferred embodiments taken in conjunction with the accompanying drawings.

DESCRIPTION OF THE PREFERRED EMBODIMENTS

Preferred embodiments of the present invention will now be described with reference to the drawings.

Figure 1:
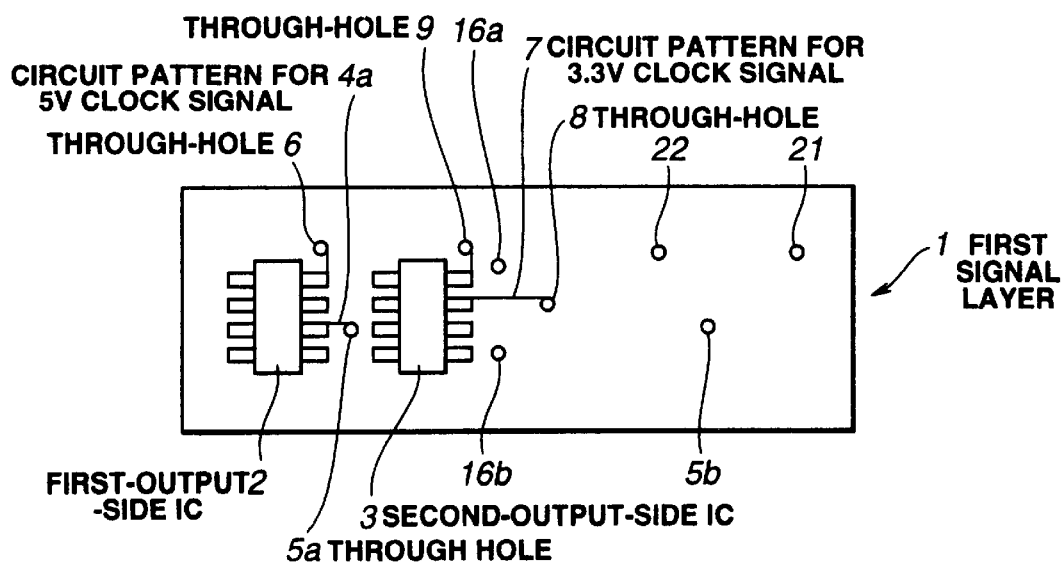
FIG. 1 is a plan view illustrating the configuration of a first conductive layer of a multilayer printed circuit board according to an embodiment of the present invention.
Figure 2:
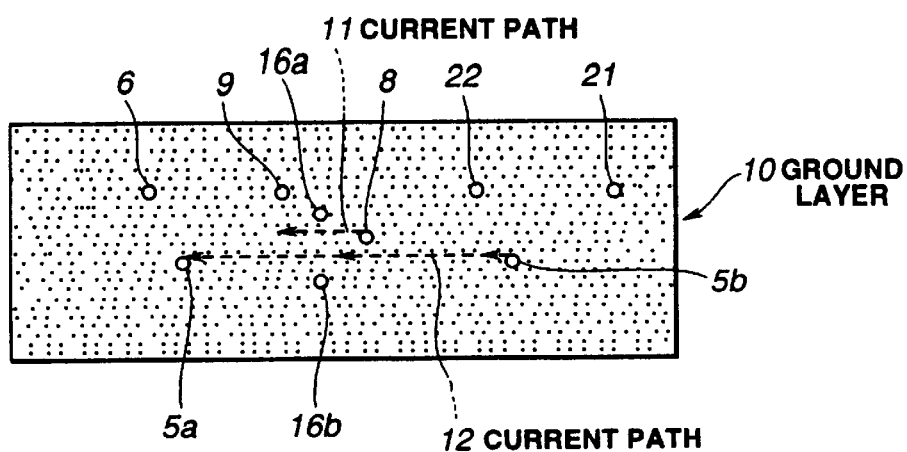
FIG. 2 is a plan view illustrating the configuration of a second conductive layer of the multilayer printed circuit board shown in FIG. 1.
Figure 3:
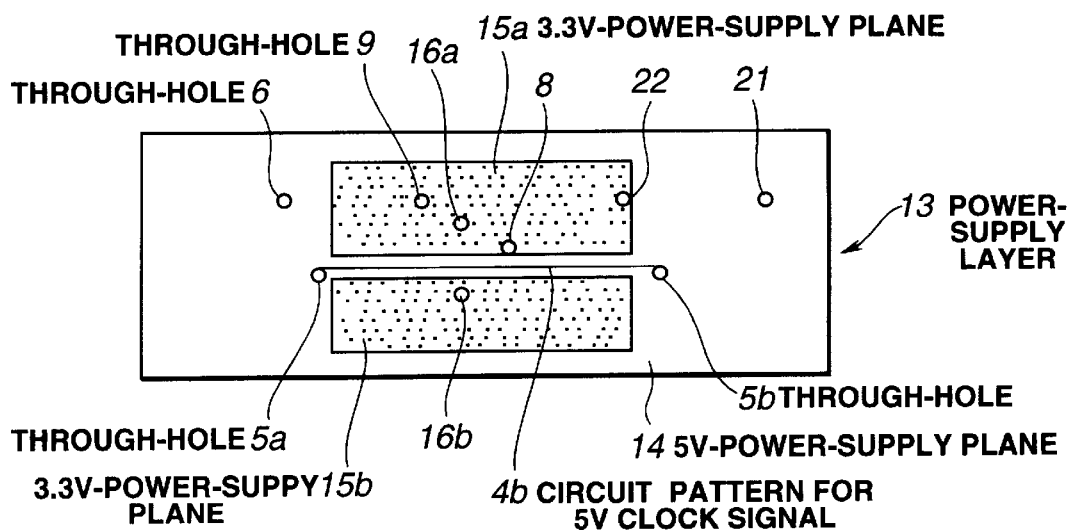
FIG. 3 is a plan view illustrating the configuration of a third conductive layer of the multilayer printed circuit board shown in FIG. 1.
Figure 4:
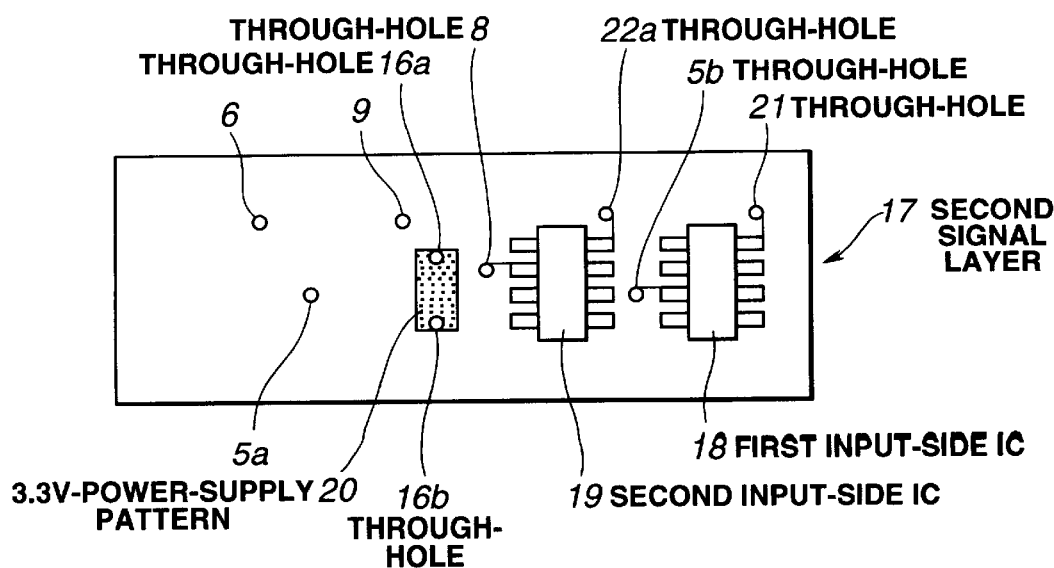
FIG. 4 is a plan view illustrating the configuration of a fourth conductive layer of the multilayer printed circuit board shown in FIG. 1.

FIG. 1 is a plan view illustrating the configuration of a first conductive layer of a multilayer printed circuit board according to an embodiment of the present invention. FIG. 2 is a plan view illustrating the configuration of a second conductive layer of the multilayer printed circuit board shown in FIG. 1. FIG. 3 is a plan view illustrating the configuration of a third conductive layer of the multilayer printed circuit board shown in FIG. 1. FIG. 4 is a plan view illustrating the configuration of a fourth conductive layer of the multilayer printed circuit board shown in FIG. 1.

In the multilayer printed circuit board shown in FIGS. 1 through 4, a first signal layer 1, a first output-side IC 2, a second output-side IC 3, a circuit pattern 4a for a 5V clock signal, through holes 6, 8, 9, 21 and 22, a circuit pattern 7 for a 3.3V clock signal, a ground layer 10, a current path 11, a power-supply layer 13, a 5V-power-supply plane 14, a second signal layer 17, a first input-side IC 18 and a second input-side IC 19 have the same configuration as the configuration in the conventional multilayer printed circuit board shown in FIGS. 11–14. Hence, further description thereof will be omitted, and a description will be provided only of configurations different from those shown in FIGS. 11–14.

As shown in FIG. 3, in the multilayer printed circuit board of the embodiment, two separated 3.3V-power-supply planes 15a and 15b are provided on the power-supply layer 13. In addition, a circuit pattern 4b for a 5V clock signal is provided between the 3.3V-power-supply planes 15a and 15b.

As shown in FIG. 4, a 3.3V-power-supply plane 20 is provided on the second signal layer 17. The 3.3V-power-supply pattern 20 and the 3.3V-power-supply plane 15a are connected to each other via a through-hole 16a, and the 3.3V-power-supply pattern 20 and the 3.3V-power-supply plane 15b are connected to each other via a through-hole 16b. Accordingly, the 3.3V-power-supply planes 15a and 15b are connected to each other via the through-holes 16a and 16b, and the 3.3V-power-supply pattern 20.

One end of the circuit pattern 4b for the 5V clock signal is connected to one of terminals of the first output-side IC 2 via a through hole 5a (see FIG. 1), and another end of the circuit pattern 4b for the 5V clock signal is connected to another terminal of the first input-side IC 18 via a through-hole 5b (see FIG. 4).

According to the above-described configuration of the embodiment, a microstrip structure is provided between the circuit pattern 7 for the 3.3V clock signal provided on the first signal layer 1, and the ground layer 10, and a microstrip structure is also provided between the circuit pattern 4b for the 5V clock signal provided on the power-supply layer 13, and the ground layer 10.

In the microstrip structure where the ground layer 10 is provided so as to face the circuit pattern 7 for the 3.3V clock signal on the first signal layer 1 in close proximity thereto, capacitive coupling and inductive coupling between the circuit pattern 7 for the 3.3V clock signal and the ground layer 10 are large. Accordingly, when a signal current flows from the second output-side IC 3 to the second input-side IC 19 via the circuit pattern 7 for the 3.3V clock signal and the through-hole 8, a return current caused by the signal current rectilinearly flows through a current path 11 on the ground layer 10 immediately below the circuit pattern 7 for the 3.3V clock signal.

In the microstrip structure where the ground layer 10 is provided so as to face the circuit pattern 4b for the 5V clock signal on the power supply layer 13 in close proximity thereto, capacitive coupling and inductive coupling between the circuit pattern 4b for the 5V clock signal and the ground layer 10 are large. Accordingly, when a signal current flows from the first output-side IC 2 to the first input-side IC 18 via the through-hole 5a, the circuit pattern 4b for the 5V clock signal, and the through-hole 5b, a return current caused by the signal current flows through a current path 12 on the ground layer 12.

By thus providing the microstrip structure in which the circuit patterns 4b and 7 for the corresponding clock signals where clock signals serving as electromagnetic radiation noise sources are transmitted, so as to face the ground layer 10 in the form of a plane in close proximity thereto, the current paths 11 and 12 for the respective return currents flow along the shortest rectilinear paths immediately below the circuit patterns 4b and 7 for the corresponding clock signals, respectively. As a result, the loop of the current in a differential mode is shortened, and the current in a common mode caused by the current in the differential mode is reduced. Hence, it is possible to reduce electromagnetic radiation noise radiated from the printed circuit board.

Although, in this embodiment, a description has been provided of a multilayer printed circuit board having two types of, i.e., 5V and 3.3V, power supply voltages, the present invention may also be applied to a multilayer printed circuit board having at least three types of power-supply voltages.

Next, a description will be provided of a multilayer printed circuit board according to a modification of the embodiment shown in FIGS. 1–4, with reference to FIGS. 5–10.

Figure 5:
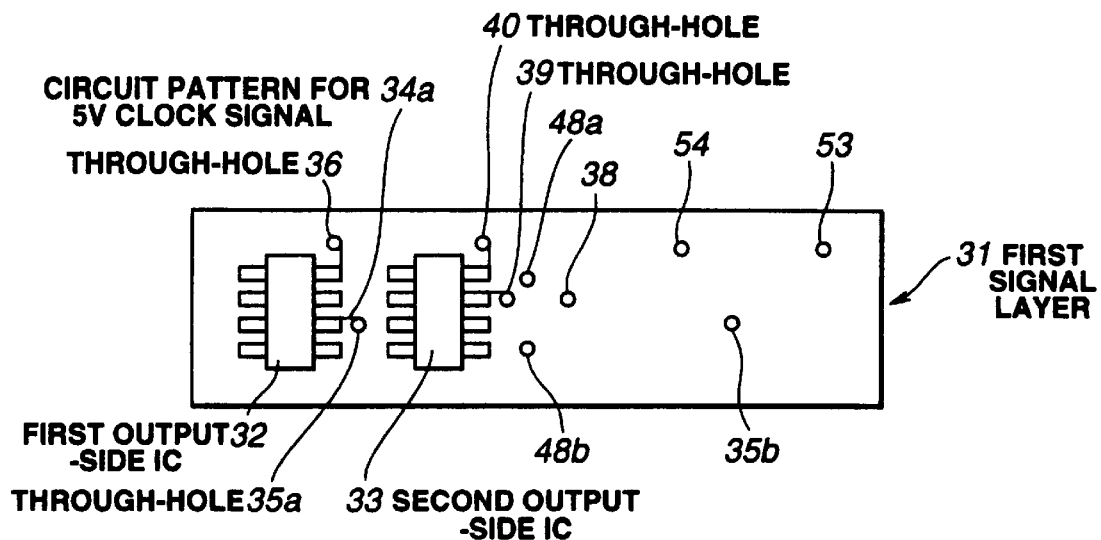
FIG. 5 is a plan view illustrating the configuration of a first conductive layer of a multilayer printed circuit board according to a modification of the embodiment.
Figure 6:
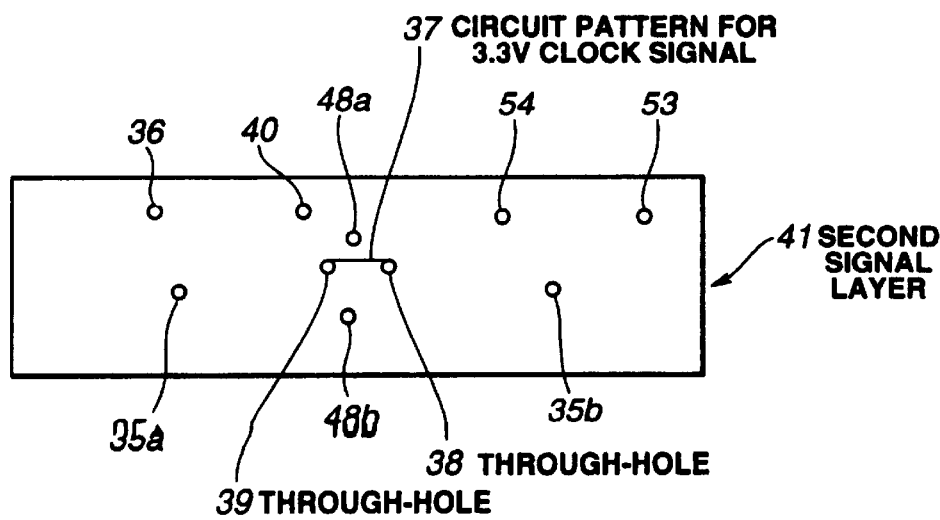
FIG. 6 is a plan view illustrating the configuration of a second conductive layer of the multilayer printed circuit board shown in FIG. 5.
Figure 7:
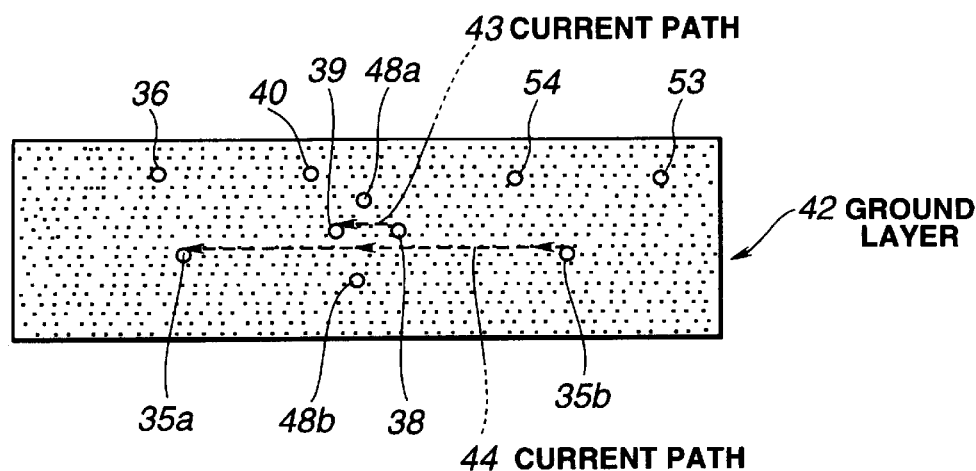
FIG. 7 is a plan view illustrating the configuration of a third conductive layer of the multilayer printed circuit board shown in FIG. 5.
Figure 8:
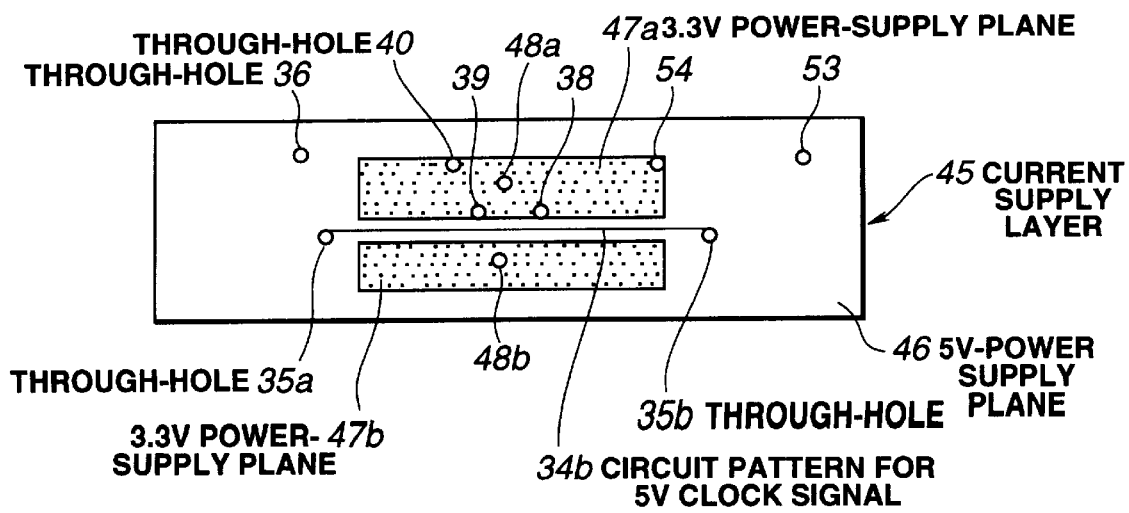
FIG. 8 is a plan view illustrating the configuration of a fourth conductive layer of the multilayer printed circuit board shown in FIG. 5.
Figure 9:
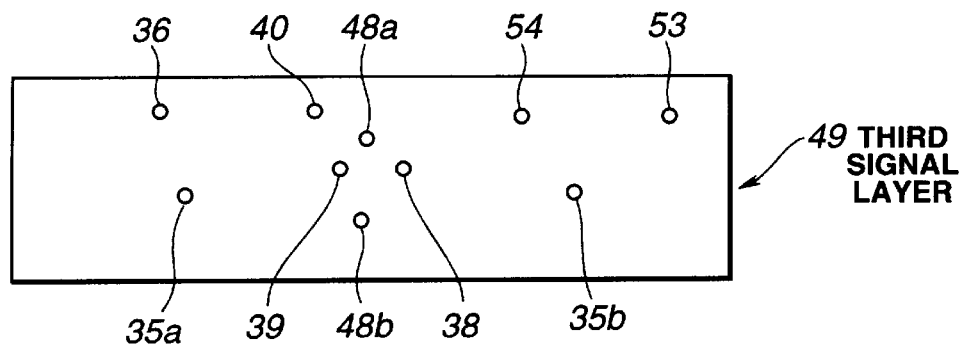
FIG. 9 is a plan view illustrating the configuration of a fifth conductive layer of the multilayer printed circuit board shown in FIG. 5.
Figure 10:
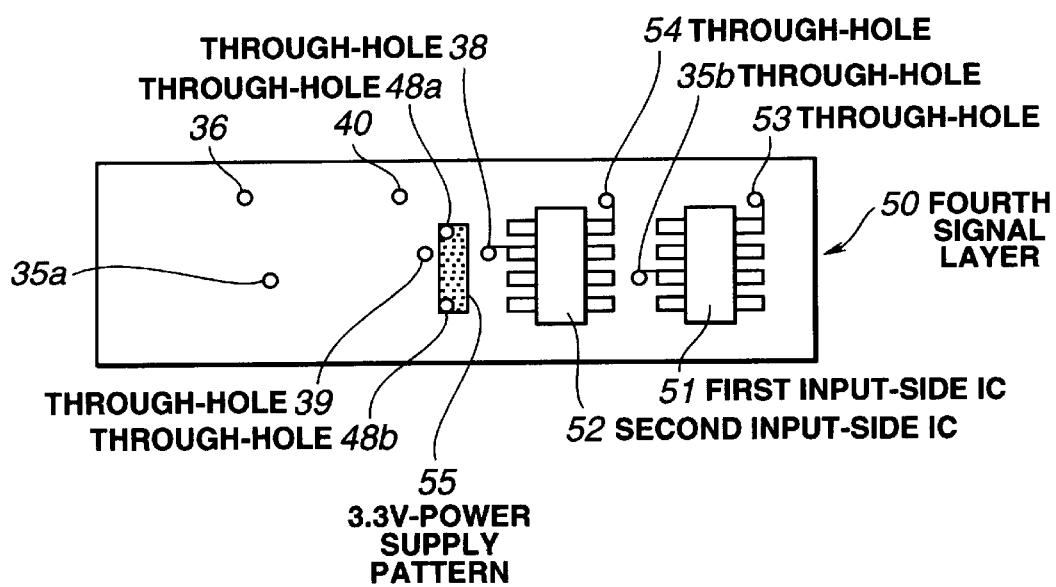
FIG. 10 is a plan view illustrating the configuration of a sixth conductive layer of the multilayer printed circuit board shown in FIG. 5.
Figure 11:
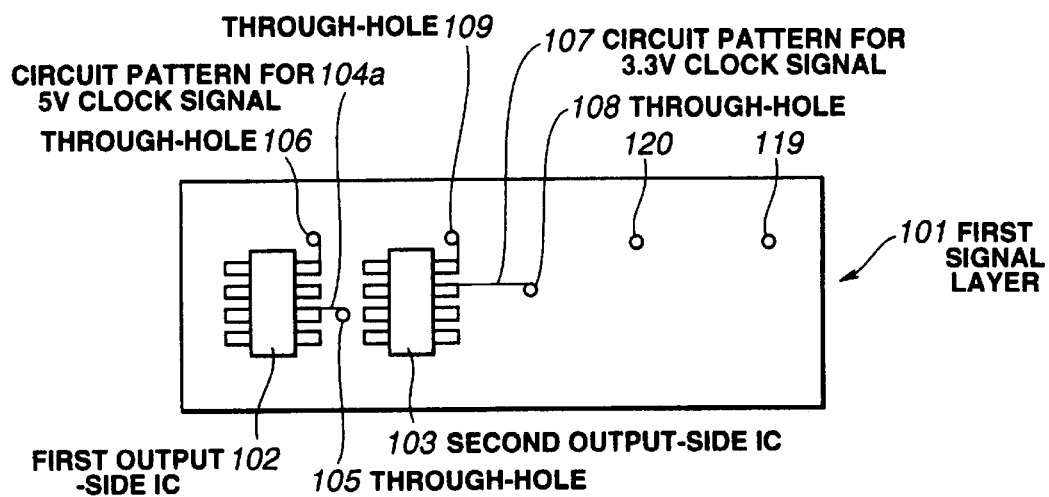
FIG. 11 is a plan view illustrating the configuration of a first conductive layer of a conventional multilayer printed circuit board.
Figure 12:
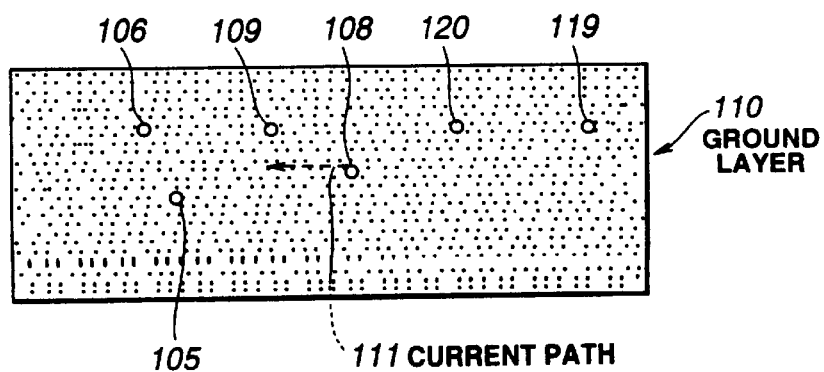
FIG. 12 is a plan view illustrating the configuration of a second conductive layer of the multilayer printed circuit board shown in FIG. 11.
Figure 13:
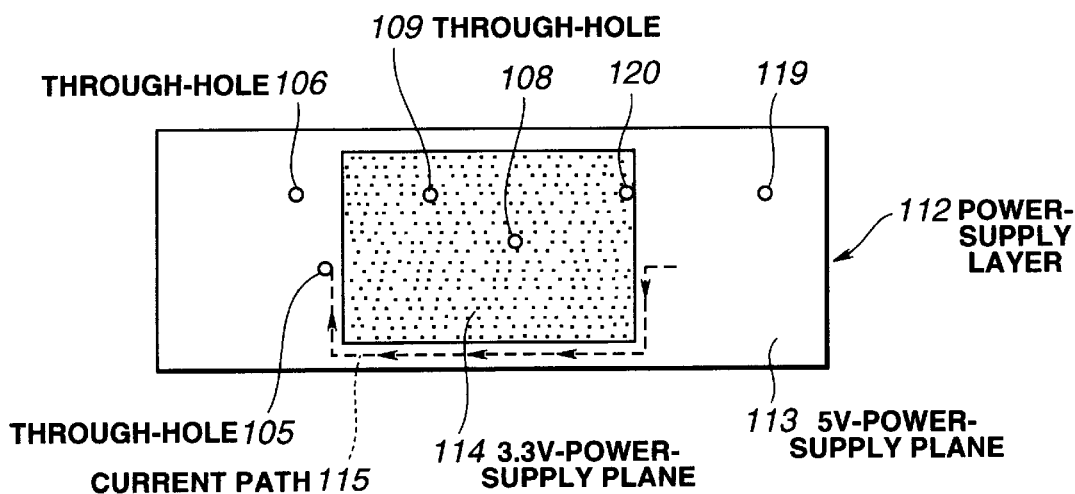
FIG. 13 is a plan view illustrating the configuration of a third conductive layer of the multilayer printed circuit board shown in FIG. 11.
Figure 14:
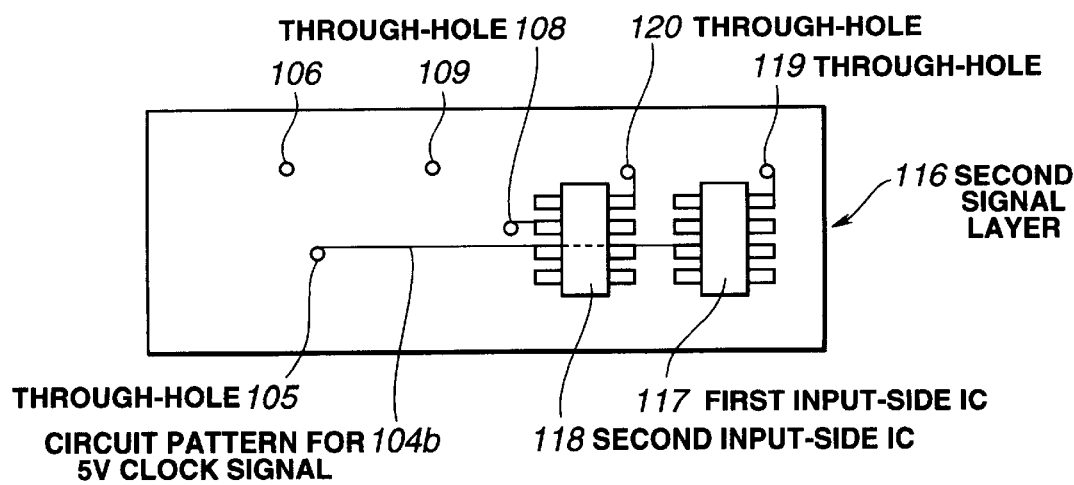
FIG. 14 is a plan view illustrating the configuration of a fourth conductive layer of the multilayer printed circuit board shown in FIG. 11.
Figure 15:
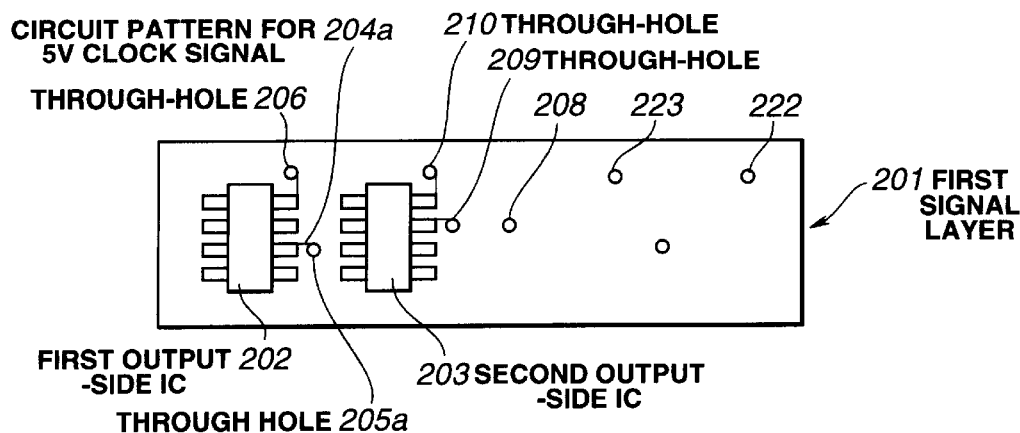
FIG. 15 is a plan view illustrating the configuration of a first conductive layer of another conventional multilayer printed circuit board.
Figure 16:
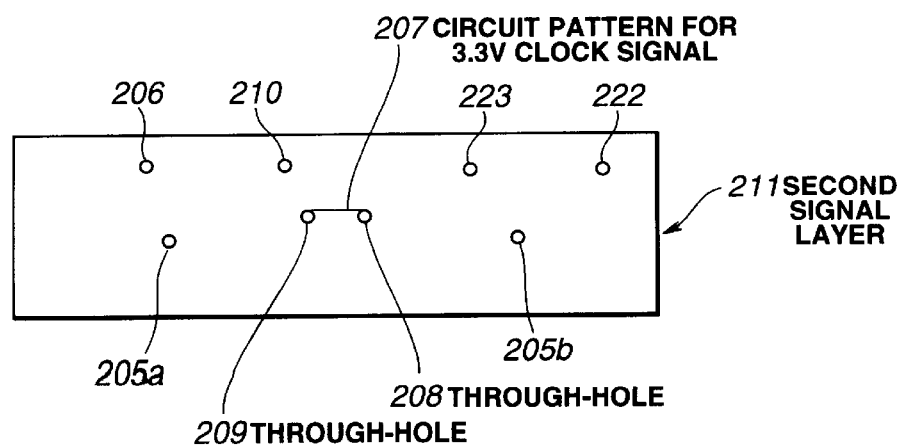
FIG. 16 is a plan view illustrating the configuration of a second conductive layer of the multilayer printed circuit board shown in FIG. 15.
Figure 17:
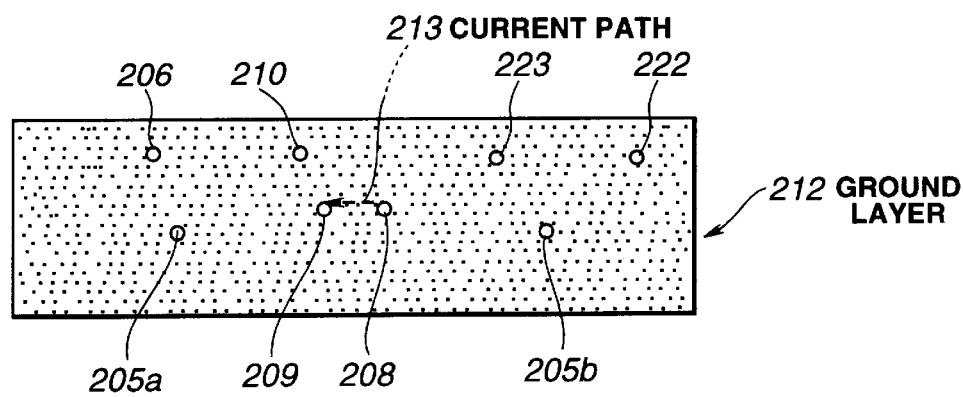
FIG. 17 is a plan view illustrating the configuration of a third conductive layer of the multilayer printed circuit board shown in FIG. 15.
Figure 18:
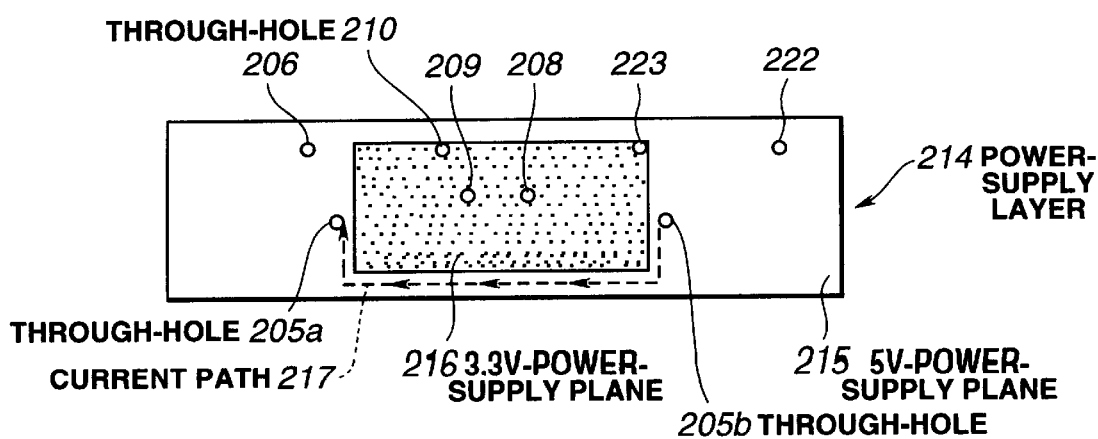
FIG. 18 is a plan view illustrating the configuration of a fourth conductive layer of the multilayer printed circuit board shown in FIG. 15.
Figure 19:
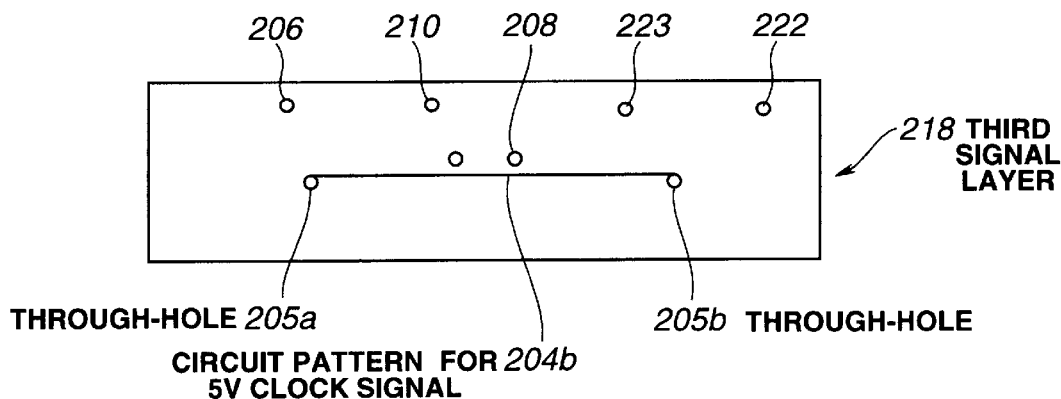
FIG. 19 is a plan view illustrating the configuration of a fifth conductive layer of the multilayer printed circuit board shown in FIG. 15.
Figure 20:
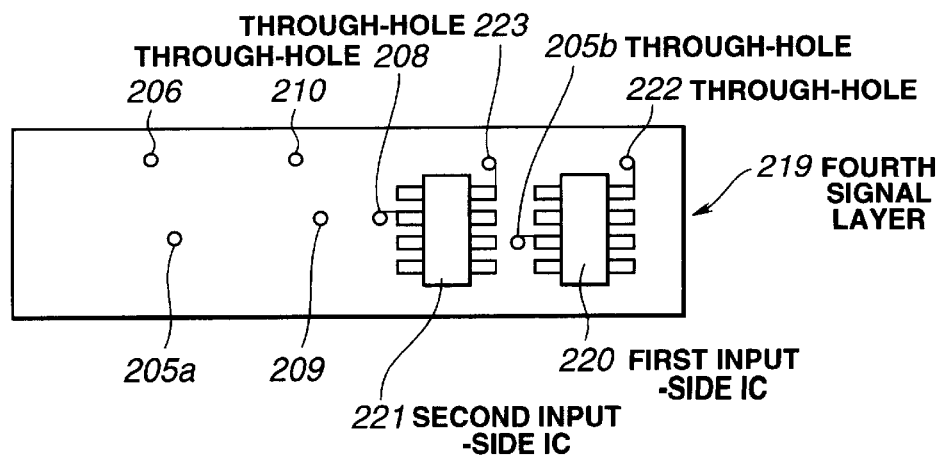
FIG. 20 is a plan view illustrating the configuration of a sixth conductive layer of the multilayer printed circuit board shown in FIG. 15.

FIG. 5 is a plan view illustrating the configuration of a first conductive layer of the multilayer printed circuit board according to a modification of the embodiment described with reference to FIGS. 1–4. FIG. 6 is a plan view illustrating the configuration of a second conductive layer of the multilayer printed circuit board shown in FIG. 5. FIG. 7 is a plan view illustrating the configuration of a third conductive layer of the multilayer printed circuit board shown in FIG. 5. FIG. 8 is a plan view illustrating the configuration of a fourth conductive layer of the multilayer printed circuit board shown in FIG. 5. FIG. 9 is a plan view illustrating the configuration of a fifth conductive layer of the multilayer printed circuit board shown in FIG. 5. FIG. 10 is a plan view illustrating the configuration of a sixth conductive layer of the multilayer printed circuit board shown in FIG. 5.

In the multilayer printed circuit board shown in FIGS. 5 through 10, a first signal layer 31, a first output-side IC 32, a second output-side IC 33, a circuit pattern 34a for a 5V clock signal, through-holes 36, 38, 39, 40, 53 and 54, a circuit pattern 37 for a 3.3V clock signal, a second signal layer 41, a ground layer 42, a current path 43, a power-supply layer 45, a 5V-power-supply plane 46, a third signal layer 49, a fourth signal layer 50, a first input-side IC 51, and a second input-side IC 52 have the same configuration as the configuration in the conventional multilayer printed circuit board shown in FIGS. 15–20. Hence, further description thereof will be omitted, and a description will be provided only of configurations different from those shown in FIGS. 15–20.

As shown in FIG. 8, in the multilayer printed circuit board of the modification, two separated 3.3V-power-supply planes 47a and 47b are provided on the power-supply layer 45. In addition, a circuit pattern 34b for the 5V clock signal is provided between the 3.3V-power-supply planes 47a and 47b.

As shown in FIG. 10, a 3.3V-power-supply pattern 55 is provided on the fourth signal layer 50. The 3.3V-power-supply pattern 55 and the 3.3V-power-supply plane 47a are connected to each other via a through-hole 48a, and the 3.3V-power-supply pattern 55 and the 3.3V-power-supply plane 47b are connected to each other via a through-hole 48b. Accordingly, the 3.3V-power-supply planes 47a and 47b are connected to each other via the through-holes 48a and 48b, and the 3.3V-power-supply pattern 55.

One end of the circuit pattern 34b for the 5V clock signal is connected to one of terminals of the first output-side IC 32 via the through-hole 35a (see FIG. 1), and another end of the circuit pattern 34b for the 5V clock signal is connected to another terminal of the first input-side IC 51 (see FIG. 10) via the through-hole 35b.

According to the above-described configuration of the modification, a microstrip structure is provided between the circuit pattern 37 for the 3.3V clock signal provided on the second signal layer 41, and the ground layer 42, and a microstrip structure is also provided between the circuit pattern 34b for the 5V clock signal provided on the power-supply layer 45, and the ground layer 42.

In the microstrip structure in which the ground layer 42 is provided so as to face the circuit pattern 37 for the 3.3V clock signal on the second signal layer 41 in close proximity thereto, capacitive coupling and inductive coupling between the circuit pattern 37 for the 3.3V clock signal and the ground layer 42 are large. Accordingly, when a signal current flows from the second output-side IC 33 to the second input-side IC 52 via the through-hole 39, the circuit pattern 37 for the 3.3V clock signal and the through-hole 38, a return current caused by the signal current rectilinearly flows through the current path 43 on the ground layer 42 immediately below the circuit pattern 37 for the 3.3V clock signal.

In the microstrip structure where the ground layer 42 is provided so as to face the circuit pattern 34b for the 5V clock signal on the power supply layer 45 in close proximity thereto, capacitive coupling and inductive coupling between the circuit pattern 34b for the 5V clock signal and the ground layer 42 are large. Accordingly, when a signal current flows from the first output-side IC 32 to the first input-side IC 51 via the through-hole 35a, the circuit pattern 34b for the 5V clock signal, and the through-hole 35b, a return current caused by the signal current rectilinearly flows through a current path 44 on the ground layer 42.

In this modification, also, as in the multilayer printed circuit board shown in FIGS. 1 through 4, the current paths 43 and 44 for the return currents flow along the shortest rectilinear paths immediately below the circuit patterns 34b and 37 for the corresponding clock signals, respectively. As a result, the loop of the current in a differential mode is shortened, and the current in a common mode caused by the current in the differential mode is reduced. Hence, it is possible to reduce electromagnetic radiation noise radiated from the printed circuit board.

The present invention may be applied not only to a four-layered or six-layered multilayer printed circuit board, but also to a multilayer printed circuit board having an arbitrary number of layers, provided that the multilayer printed circuit board includes a ground layer provided in the form of a plane, and a power-supply layer and a signal layer provided so as to face the ground layer.

As described above, the multilayer printed circuit board of the present invention includes at least two conductive layers including a power-supply layer, where a plurality of power-supply planes are provided, and a ground layer. A circuit pattern for transmitting a signal serving as an electromagnetic radiation noise source is formed on a conductive layer facing the ground layer. Hence, a return current flows along the shortest rectilinear path on the ground layer, and electromagnetic radiation noise radiated from the multilayer printed circuit board can be reduced.

According to the configuration in which the power-supply layer is provided so as to face the ground layer, at least one power-supply plane from among a plurality of power-supply planes is divided, and a circuit pattern is formed between power-supply planes obtained by dividing the original power-supply plane, the circuit pattern is arranged so as not to cross over a power-supply plane having a power-supply voltage different from the voltage of a signal transmitted through the circuit pattern. Hence, the conventional flow of the return current along a large loop detouring around the power-supply plane is prevented.

The individual components shown in outline in the drawings are all well known in the multilayer printed circuit board arts, and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A multilayer printed circuit board comprising:
   a first signal layer forming one surface, said first signal layer including first electronic components, each generating a clock signal serving as a radiation noise source;
   a second signal layer forming another outer surface, said second signal layer including second electronic components receiving the clock signals from the first electronic components provided on said first signal layer;
   a power-supply layer provided between said first signal layer and said second signal layer, said power-supply layer including a plurality of power-supply planes having different supply voltages, at least one of the plurality of power-supply planes being divided, and a circuit pattern for a clock signal for electrically connecting the first electronic components and the second electronic components to each other being provided between power-supply planes obtained by dividing the original power-supply plane; and a ground layer provided between one of said first signal layer and said second signal layer, and said power-supply layer, said ground layer being provided so as to face the circuit pattern for a clock signal on said power-supply layer.

2. A multilayer printed circuit board according to claim 1, wherein said ground layer is provided in the form of a single plane, and wherein a return current flows in said ground layer, caused by flow of a signal current in the circuit pattern for a clock signal on said power supply layer.

3. A multilayer printed circuit board according to claim 1, wherein said second signal layer includes a power-supply pattern for connecting the power-supply planes obtained by dividing the original power-supply plane on said power-supply layer.

4. A multilayer printed circuit board comprising:

a signal layer including at least one electronic component generating a clock signal serving as a radiation noise source;

a power-supply layer including a plurality of power-supply planes having different supply voltages, at least one power-supply plane from among the plurality of power-supply planes being divided, and a circuit pattern for a clock signal for transmitting the clock signal serving as the radiation noise source generated from the component being provided between power-supply planes obtained by dividing the original power-supply plane; and a ground layer provided between said signal layer and said power-supply layer, said ground layer being provided so as to face the circuit pattern for a clock signal on said power-supply layer.

5. A multilayer printed circuit board comprising:

a first signal layer including at least one electronic component generating a clock signal serving as a radiation noise source;

a second signal layer including at least one other electronic component receiving the clock signal from the at least one electronic component provided on said first signal layer;

a power-supply layer provided between said first signal layer and said second signal layer, said power-supply layer including a plurality of power-supply planes having different supply voltages, and a circuit pattern for a clock signal for electrically connecting said first electronic component and said second electronic component to each other; and a ground layer provided between one of said first signal layer and said second signal layer, and said power-supply layer, said ground layer being provided so as to face the circuit for a clock signal on said power-supply layer.

6. A multilayer printed circuit board according to claim 5, wherein at least one power-supply plane on said power-supply layer is divided, and wherein the circuit pattern for a clock signal is provided between power-supply planes obtained by dividing the original power-supply plane.

7. A multilayer printed circuit board according to claim 6, wherein said second signal layer includes a power-supply pattern for connecting the power-supply planes obtained by dividing the original power-supply plane.

8. A multilayer printed circuit board comprising:

a first signal layer including at least one electronic component generating a clock signal serving as a radiation noise source;

a second signal layer including at least one other electronic component receiving the clock signal from the at least one electronic component provided on said first signal layer;

a power-supply layer provided between said first signal layer and said second signal layer, said power-supply layer including a plurality of power-supply planes, and a circuit pattern for a clock signal for electrically connecting said first electronic component and said second electronic component to each other between the plurality of power-supply planes; and a ground layer provided between said first signal layer and said power-supply layer, said ground layer being provided so as to face the circuit pattern for a clock signal on said power-supply layer.

9. A multilayer printed circuit board according to claim 8, wherein said second signal layer includes a power-supply pattern for connecting the plurality of power-supply planes on said power-supply layer.

10. A multilayer printed circuit board including electronic components, each generating a clock signal, serving as a radiation noise source, on a signal layer, said multilayer printed circuit board comprising:

a power-supply layer including a plurality of power-supply planes having different supply voltages, said power-supply layer including a circuit pattern for a clock signal for transmitting the clock signals, serving as radiation noise sources, generated from the electronic components provided on the signal layer; and a ground layer provided so as to face the circuit pattern for a clock signal on said power-supply layer.

11. A multilayer printed circuit board according to claim 10, wherein at least one power-supply plane on said power-supply layer is divided, and wherein the circuit pattern for a clock signal is provided between power-supply planes obtained by dividing the original power-supply plane.

12. A multilayer printed circuit board according to claim 10, wherein said ground layer is provided in the form of a single plane, and wherein a return current flows in said ground layer caused by flow of a signal current in the circuit pattern for a clock signal on said power supply layer.

13. A multilayer printed circuit board comprising:

a first signal layer including at least one of each of first and second electronic components, each generating a clock signal serving as a radiation noise source, said first signal layer including a first circuit pattern for a clock signal for transmitting the clock signal serving as the radiation noise source generated from the first electronic component;

a second signal layer including at least one of each of third and fourth electronic components receiving the signals from the at least one of each of the first and second electronic components provided on said first signal layer; and a power-supply layer provided between said first signal layer and said second signal layer, said power-supply layer including first and second power-supply planes having different supply voltages, the first power-supply plane supplying the first and third electronic components with a voltage, the second power-supply plane supplying the second and fourth electronic components with a voltage, and said power-supply layer also including a second circuit pattern for a clock signal for transmitting the clock signal, serving as the radiation noise source, generated from the second electronic component; and a ground layer provided between said first signal layer and said power-supply layer, said ground layer being provided so as to face the first circuit pattern for a clock signal on said first signal layer and the second circuit pattern for a clock signal on said power-supply layer.

14. A multilayer printed circuit board according to claim 13, wherein the first power-supply plane on said power-supply plane is divided, and wherein the second circuit pattern for a clock signal is provided between power-supply planes obtained by dividing the first power-supply plane.

15. A multilayer printed circuit board according to claim 13, wherein said second signal layer includes a power-supply pattern for connecting the power-supply planes obtained by dividing the original power-supply plane on said power-supply layer.

16. A multilayer printed circuit board comprising:

a signal layer including at least one of each of first and second electronic components, each generating a clock signal serving as a radiation noise source, said signal layer including a first circuit pattern for a clock signal for transmitting the clock signal serving as the radiation noise source generated from the first electronic component;

a power-supply layer including first and second power-supply planes having different supply voltages, the first power-supply plane supplying the first electronic component with a voltage, the second power-supply plane supplying the second electronic component with a voltage, and said power-supply layer also including second circuit pattern for a clock signal for transmitting the clock signal, serving as the radiation noise source, generated from the second electronic component; and a ground layer provided between said signal layer and said power-supply layer, said ground layer being provided so as to face the first circuit pattern for a clock signal on said signal layer and the second circuit pattern for a clock signal on said power-supply layer.

17. A multilayer printed circuit board according to claim 16, wherein the first power-supply plane on said power-supply plane is divided, and wherein the second circuit pattern for a clock signal is provided between power-supply planes obtained by dividing the first power-supply plane.

18. A multilayer printed circuit board according to claim 17, wherein another signal layer includes a power-supply pattern for connecting the power-supply planes obtained by dividing the first power-supply plane on said power-supply layer.

* * * * *